US006885182B2

United States Patent
Bohnert et al.

(10) Patent No.: US 6,885,182 B2
(45) Date of Patent: Apr. 26, 2005

(54) TEMPERATURE-COMPENSATED ELECTRO-OPTICAL VOLTAGE SENSOR

(75) Inventors: Klaus Bohnert, Oberrohrdorf (CH); Andreas Frank, Zürich (CH); Hubert Brändle, Oberengstringen (CH)

(73) Assignee: ABB Research LTD, Zurich (CH)

( * ) Notice: Subject to any disclaimer, the term of this patent is extended or adjusted under 35 U.S.C. 154(b) by 0 days.

(21) Appl. No.: 10/804,160

(22) Filed: Mar. 19, 2004

(65) Prior Publication Data

US 2004/0239307 A1 Dec. 2, 2004

(30) Foreign Application Priority Data

Mar. 28, 2003 (EP) .............................................. 03405213

(51) Int. Cl.[7] .............................................. G01R 19/00
(52) U.S. Cl. ....................................... 324/96; 324/72.5
(58) Field of Search ...................... 324/96, 72.5, 158.1, 324/105, 117 R, 117 H; 385/16–18, 33, 47; 250/231.1, 206; 356/351, 352; 372/10, 26; 359/122

(56) References Cited

U.S. PATENT DOCUMENTS

| | | | |
|---|---|---|---|
| 4,269,483 A | | 5/1981 | Feldtkeller |
| 4,465,969 A | | 8/1984 | Tada et al. |
| 4,563,093 A | | 1/1986 | Tada et al. |
| 4,939,447 A | | 7/1990 | Bohnert et al. |
| 5,055,770 A | * | 10/1991 | Takahashi et al. ............ 324/96 |
| 5,109,189 A | * | 4/1992 | Smith .......................... 324/96 |
| 5,111,135 A | * | 5/1992 | Kozuka et al. ................ 324/96 |
| 6,252,388 B1 | | 6/2001 | Jaeger et al. |
| 6,307,666 B1 | | 10/2001 | Davidson et al. |

FOREIGN PATENT DOCUMENTS

| | | |
|---|---|---|
| DE | 19716477 A1 | 9/1998 |
| EP | 0682261 A2 | 11/1995 |
| EP | 0997738 A2 | 5/2000 |

OTHER PUBLICATIONS

"New Multi–Segment Pockels Device for High–Voltage Measurement", J.C. Santos, et al., Int. Conf. on Electrical Engineering, Proc. ICEE 1996, pp. 1366–1371.

"Fiber–optic sensing of voltages by line integration of the electric field", K. Bohnert, et al., 1989 Optical Society of America, pp. 290–292.

"Electromagnetic field components: their measurement using linear electrooptic and magnetooptic effects", G.A. Massey, et al., Applied Optics, vol. 14, No. 11, Nov. 1975, pp. 2712–2719.

\* cited by examiner

*Primary Examiner*—David Zarneke
*Assistant Examiner*—Jimmy Nguyen
(74) *Attorney, Agent, or Firm*—Burns, Doane, Swecker & Mathis, L.L.P.

(57) ABSTRACT

The electra-optical voltage sensor has an electra-optically active medium and a distance medium between two electrodes, between which the voltage V to be measured is present. The media and the thicknesses $d_1$, $d_2$ of the media are chosen in such a way that the measured voltage signal has no temperature dependence. By way of example, the thicknesses $d_1$, $d_2$ are chosen in such a way that the influence of the temperature dependences of critical electra-optical coefficients and dielectric constants of the media on the voltage signal cancel one another out. The two media are advantageously arranged in the form of a rod, comprising an alternating arrangement of cylindrical elements of the two media, between the electrodes. BGO and fused silica may advantageously be used as media. The sensor is preferably cast in silicone. It is possible to realize a mechanically stable, temperature-stabilized voltage sensor with low reflection losses, a large half wave voltage and a small sensitivity toward disturbances of the electric field.

15 Claims, 3 Drawing Sheets

TEMPERATURE-COMPENSATED ELECTRO-OPTICAL VOLTAGE SENSOR

TECHNICAL FIELD

The invention relates to the field of electro-optical voltage sensor technology, in particular of high-voltage measurement. It relates to an electro-optical voltage sensor in accordance with the preamble of patent claim 1 and to a method for electro-optical voltage measurement in accordance with the preamble of patent claim 15.

PRIOR ART

Such a voltage sensor and a corresponding method are disclosed for example in EP 0 682 261 A2. An electrical voltage V to be measured is applied to two ends of an electro-optical crystal. Linearly polarized light is radiated into the crystal and propagates therein in the form of two mutually orthogonally polarized light waves. The light is detected after traversing the crystal. As a result of the Pockels effect, a voltage-dependent birefringence is induced in the crystal, so that a change in polarization of the light that has emerged from the crystal, said change being proportional to the electrical voltage V to be measured, can be detected, for example in the form of an intensity modulation of the light.

The electro-optical coefficient critical for the Pockels effect usually has a temperature dependence. For a BGO crystal ($Bi_4Ge_3O_{12}$), by way of example, this temperature dependence is $1.54 \times 10^{-4}/° C$. (P. A. Williams et al., Applied Optics 35, 3562–3569, 1996). In the abovementioned EP 0 682 261 A2, the voltage determined from the measured change in polarization is corrected computationally for temperature effects, a known temperature dependence of a $\lambda/4$ plate which is situated in the light path and arranged near to the electro-optical crystal being utilized for determining the temperature of the electro-optical crystal.

Such a voltage sensor has the disadvantage that various approximation assumptions have to be made for the computational temperature compensation, and that the measured temperature does not necessarily correspond to the temperature of the electro-optical crystal. Thus, such a temperature compensation is computationally complex, on the one hand, and not very accurate, on the other hand.

SUMMARY OF THE INVENTION

Therefore, it is an object of the invention to provide an electro-optical voltage sensor and a corresponding measurement method of the type mentioned in the introduction which do not have the disadvantages mentioned above. In particular, the intention is to enable a simple and accurate temperature compensation. In a predeterminable temperature range, the voltage determined by means of the sensor is intended to be essentially independent of the temperature.

This object is achieved by means of an electro-optical voltage sensor having the features of patent claim 1 and a method having the features of patent claim 15.

In the voltage sensor according to the invention, at least two media are arranged between the two electrodes, at which the voltage V to be measured is present, at least one of which media is an electro-optically active medium, the effective thicknesses of the media being chosen in such a way that the voltage signal of the sensor is essentially not dependent on the temperature. Through the choice of the thicknesses of the media and the type of media, it is possible to achieve a reciprocal cancellation of different temperature influences on the voltage determined by means of the sensor (voltage signal of the sensor).

The sensor according to the invention is an electro-optical voltage sensor for measurement of an electrical voltage V, the voltage V being present between two electrodes and generating an electric field, the electrodes being arranged in a manner spaced apart from one another, and an electro-optically active medium being arranged between the electrodes, into which medium light can be radiated, it being possible to influence the state of polarization of said light in the electro-optically active medium by means of the electric field and to detect it after emergence from the electro-optically active medium, it being possible to determine the voltage V from the detected state of polarization.

It is characterized in that a distance medium is arranged between the two electrodes, the electron optically active medium being arranged with an effective thickness $d_1$ and the distance medium with an effective thickness $d_2$ between the two electrodes and the effective thicknesses $d_1$, $d_2$ being chosen in such a way that temperature influences on the detected state of polarization of the light are essentially compensated for.

Or it is characterized in that a distance medium is arranged between the two electrodes, an effective thickness $d_2$ of the distance medium and an effective thickness $d_1$ of the electro-optically active medium being chosen in such a way that temperature influences on the detected state of polarization of the light are essentially compensated for. The two media are arranged essentially one behind the other between the electrodes. Arranging the media 1, 2 one behind the other does not, of course, preclude the possibility of arranging the media 1, 2 in the form of a plurality of elements which are arranged at least in part one behind the other between the electrodes 3, 4. The effective thicknesses of the media may depend on the light guidance.

As a result, it becomes possible to achieve a temperature-independent voltage measurement. The temperature compensation is intrinsic, so that there is no need for separate temperature measurement and/or computational temperature compensation. Moreover, it is possible still to obtain unambiguous measurement results even at high voltages V. Furthermore, the arrangement of an electro-optically active medium and of a distance medium between the electrodes permits the realization of relatively large electrode distances, thereby enabling a small sensitivity toward external disturbances of the electric field and relatively small diameters of an insulation surrounding the sensor.

Preferably, the effective thickness $d_2$ of the distance medium and the effective thickness $d_1$ of the electro-optically active medium are chosen in such a way that the influences of the temperature dependences of temperature-dependent material constants of the distance medium and of the electro-optically active medium on the detected state of polarization of the light are essentially compensated for.

In particular, in practice, the material constants
critical electro-optical coefficient (k),
dielectric constant ($\in$) and
thermal expansion coefficient ($\alpha$)
are important and usually temperature-dependent.

Since, in the case of typical materials, the influence of the thermal expansion coefficients ($\alpha$) on the temperature dependence of the voltage signal of the sensor is half or a whole order of magnitude smaller than the influence of the temperature dependence of the dielectric constants ($\in$) and, in particular, of the critical electro-optical coefficient (k), a good temperature compensation can already be achieved by taking into account only the dielectric constants (∈) and the critical electro-optical coefficients (k). If the distance medium is not electro-optically active or radiation does not pass through it, only $\in_1$, $\in_2$ and $k_1$ need be taken into account, the index 1 representing the electro-optically active medium and the index 2 representing the distance medium. The influences of the temperature dependences of the respective quantities on the voltage signal (or on the detected state of so polarization of the light) essentially reciprocally cancel one another out.

In one advantageous embodiment, the distance medium is transparent and of a solid state of aggregation. The light, the state of polarization of which is altered by the electric field, is advantageously radiated through the electro-optically active medium and also the distance medium. A mechanically and optically stable construction can be achieved as a result. The distance medium may be chosen in such a way that refractive index differences at interfaces between distance medium and electro-optically active medium are small, so that reflection losses are minimal. As a result, it is possible to minimize light losses at interfaces, so that measurement can be effected in conjunction with a low light power.

In a further advantageous embodiment, a stack of N elements of the electro-optically active medium and (N+1) elements of the distance medium is arranged between the electrodes, N being an integer where N≧1, advantageously N≧2. In each case an element of the electro-optically active medium is arranged between two adjacent elements of the distance medium, the first and the last element in the stack being in contact with a respective one of the two electrodes. This yields an accurate approximation to the voltage V to be measured, with low reflection losses and with high mechanical stability. In a particularly advantageous manner, each of the elements is essentially cylindrical, all the elements having essentially the same cylinder diameter. The media arranged between the electrodes advantageously form a sensor rod.

A further advantageous embodiment is characterized in that the elements of the electro-optically active medium have such an effective thickness and are arranged between the electrodes in such a way that a deviation between the voltage signal of the sensor, that is to say the voltage determined by means of the voltage sensor, and the voltage V to be measured is minimal. Such an arrangement can be determined for example by means of approximation calculations or simulations. It is possible to obtain particularly accurate measurements and a high degree of insensitivity toward external disturbances of the electric field, for example on account of rain or snow in proximity to the sensor, and with respect to transverse fields, for example on account of adjacent electrical phases near the sensor.

In a particularly advantageous manner, the electrodes together with the electro-optically active medium and the distance medium may be cast in silicone. The silicone advantageously has a layer thickness large enough that, in the presence of lightning impulse voltages (in accordance with IEC Standard 186, IEC=International Electrotechnical Commission, Geneva, Switzerland) an electric field strength on the outside of the silicone is at most 40 kV/mm, and in particular at most 30 kV/mm. Lightning impulse voltages for instance three to five times the operating voltage for which the sensor is designed. For an operating voltage of 170 kV, the lightning impulse voltage which the sensor must still withstand is 750 kV (peak value); for an operating voltage of 245 kV, the lightning impulse voltage is 1050 kV; for an operating voltage of 420 kV, the lightning impulse voltage is 1425 kV (in accordance with IEC Standard 186).

By virtue of the silicone sheathing, it is possible to produce a sensor having very small dimensions and a low weight which nevertheless has a sufficient electrical insulation. Expensive, large, heavy insulation tubes, typically made of glass-fiber-reinforced plastic, can be avoided. The low weight and the small dimensions enable the sensor to be used at locations or in positions at or in which conventionally insulated sensors cannot be used. For example suspended from a high-voltage-carrying installation part.

A particularly advantageous embodiment is characterized in that the electro-optically active medium is crystalline BGO (bismuth germanium oxide, $Bi_4Ge_3O_{12}$) which is oriented with its [001] direction parallel to the direction of propagation of the light, and in that the direction of propagation of the light essentially runs along the electric field generated by the voltage V, and in that the distance medium is fused silica. As a result, it is possible to realize a particularly well temperature-stabilized sensor which, moreover, is highly insensitive toward external disturbances of the field distribution. In particular, it is thus very readily possible to perform measurements at one pole of a high-voltage network without a further pole situated in the vicinity influencing the measurement.

The method according to the invention for measurement of an electrical voltage V, the voltage V being present between two electrodes arranged in a manner spaced apart from one another and generating an electric field, light being radiated into an electro-optically active medium arranged between the electrodes, a state of polarization of the light being influenced in the electro-optically active medium by means of the electric field and the light being detected after emergence from the electro-optically active medium and the voltage V being determined from the detected state of polarization, is characterized in that a distance medium is arranged between the two electrodes, an effective thickness $d_2$ of the distance medium and an effective thickness $d_1$ of the electro-optically active medium being chosen in such a way that temperature influences on the detected state of polarization of the light are essentially compensated for.

Further preferred embodiments and advantages emerge from the dependent patent claims and the figures.

BRIEF DESCRIPTION OF THE DRAWINGS

The subject matter of the invention is explained in more detail below using preferred exemplary embodiments illustrated in the accompanying drawings, in which.

The reference symbols used in the drawings and their meaning are summarized in the List of designations. In principle, identical or at least identically acting parts are provided with the same reference symbols in the figures. The exemplary embodiments described represent the subject matter of the invention by way of example and have no restrictive effect.

WAYS OF EMBODYING THE INVENTION

Figure 1:
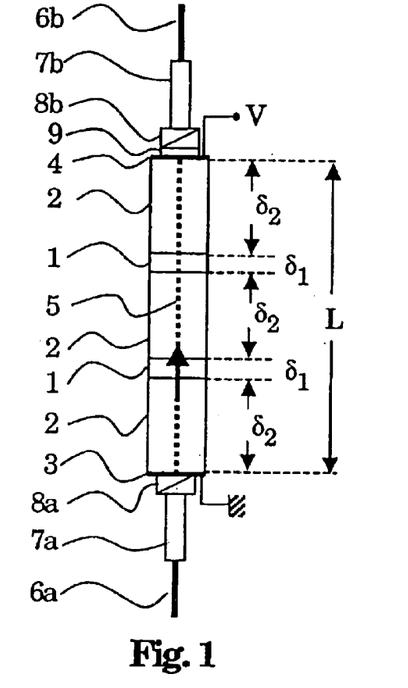
FIG. 1 diagrammatically shows a sensor according to the invention in transmission geometry.

FIG. 1 shows a sensor in transmission geometry, comprising N=2 BGO crystal sheets 1 and N+1=3 sheets of fused silica. This stack of BGO and fused silica sheets forms a rod, a sensor rod. FIG. 1 illustrates principally the optical components. The BGO sheets 1 have a thickness $\delta_1$ and are arranged between the fused silica sheets 2 having the thickness $\delta_2$. In an advantageous manner, all the sheets are cylindrical with the same diameter. In an advantageous manner, all the BGO sheets have the same crystalline orientation. A respective electrode 3, 4 is preferably fitted to each end of the stack comprising BGO and fused silica sheets. Said electrode is advantageously made of ITO (indium tin oxide) so that it is transparent. The first electrode 3 is at ground potential and the second electrode 4 is at the potential V. The voltage V is to be measured.

A light beam 5 propagates in the electro-optically active medium 1. Light generated by a light source (not illustrated is fed via an optical feed fiber 6a, advantageously a multimode fiber. The light source used is advantageously a light-emitting diode (LED), a superluminescent diode or a multimode laser diode. The light 5 is fed to a collimator lens 7a and then to a polarizer 8a. Through the transparent electrode 3, the light 5 passes into the stack of BGO and fused silica elements. Two mutually orthogonally polarized light waves then advantageously propagate in the stack.

As a result of the electro-optical effect of Pockels effect (=linear electro-optical effect), the state of polarization of the light 5 is altered in the electro-optically active medium 1 (BGO) since a voltage-induced birefringence, is produced. The magnitude of the influencing of the state of polarization of the light 5 depends on the magnitude of the electric field in the BGO elements, that is to say on the voltage V. If two mutually orthogonally polarized light waves propagate in the electro-optically active medium 1, the electro-optical effect makes it possible to achieve a delay of one light wave relative to the other light wave, thereby producing a phase shift between the light waves. To a good approximation, said phase shift is proportional to the voltage V to be measured.

After traversing the stack, the light 5 passes through the electrode 4, through a $\lambda/4$ element 9, through a polarizer 8b and a collimator lens 7b and is finally fed by means of the optical fiber 6b, which is advantageously a multimode fiber, to a detection-evaluation unit (not illustrated). The polarizers 8a, 8b are advantageously oriented along the [100] direction of the BGO crystals and thus at 45° with respect to the birefringence axes induced in the BGO material. The axes of the $\lambda/4$ element 9 are oriented parallel to the birefringence axes induced in the BGO material. In the detection-evaluation unit (not illustrated), the voltage-induced alteration of the state of polarization of the light 5 is determined, in particular by means of a change in a normalized light intensity, said change being produced on account of the phase shift, and a measure of the voltage V, the voltage signal, is obtained therefrom. Principles and details concerning electro-optical voltage measurement can be gathered from the prior art, for example the abovementioned EP 0 682 261 A2. The disclosure content of this document is hereby expressly incorporated into the description. Further principles of electro-optical voltage measurement and detection can be gathered for example from the publication G. A. Massey, D. C. Erickson, and R. A. Kadlec, Applied Optics 14, 2712–2719, 1975. The disclosure content of this text is hereby expressly incorporated into the description.

The effective thickness of the electro-optically active medium 1 (BGO) is equal to $d_1=2\cdot\delta_1$ in FIG. 1. The effective thickness of the distance medium 2 (fused silica) is equal to $d_2=3\cdot\delta_2$. $\delta$ denotes the effective thicknesses of the individual elements of the media 1, 2. L denotes an effective distance between the electrodes 3, 4. In FIG. 1, the two media 3, 4 are arranged along the entire length L.

Through a suitable choice of the effective thicknesses $d_1$, $d_2$, it is possible to influence the relative temperature dependence of the electric field in the BGO sheets 1. This can be used to compensate for the temperature dependence of the electro-optical effect, as is shown below. In this case, only two different materials 1, 2 are considered, influences of the temperature dependences of further quantities, such as, for example of the thermal expansion coefficient a, being disregarded, moreover, compared with the temperature dependences of critical electro-optical coefficients k and dielectric constants $\in$. In any event, an influence of the temperature dependence of the thermal expansion coefficient $\alpha$ is generally manifested only when the thermal expansion coefficients $\alpha_1$ and $\alpha_2$ of the two media 1, 2 differ from one another.

In a sensor such as that illustrated in FIG. 1 with an electro-optically active medium 1 (BGO) and a distance medium 2 (fused silica), which is not electro-optically active in the case of fused silica, the following holds true for the relative temperature dependence of the electric field strength $E_1$ in the medium 1:

$$(1/E_1)\cdot(\partial E_1/\partial T)=[d_2/(\in_2\cdot d_1+\in_1\cdot d^2)]\cdot[(\in_1/\in_2)(\partial\in_2/\partial T),-(\partial\in_1\partial T)]$$

where $\in_1$ is the dielectric constant of the electro-optically active medium 1 and $\in_2$ is the dielectric constant of the distance medium 2. The electric field strength $E_1$ in the medium 1 may be specified to the approximation of infinitely extended stack elements (sheet radius infinite) as $$E_1\approx\in_2\cdot V/(\in_2\cdot d_1+\in_1\cdot d_2).$$

For BGO, $\in_1=16.3$, and, for fused silica, $\in_2=3.8$.

If radiation is passed through both media 1, 2, it being possible for both to be electro-optically active, then the following holds true in the case of the temperature-compensating choice of the thicknesses $d_1$, $d_2$:

$$d_1\cdot[(\partial k_1/\partial T)\cdot E_1+k_1\cdot(\partial E_1/\partial T)]+d_2\cdot[(\partial k_2/\partial T)\cdot E_2+k_2\cdot(\partial E_2/\partial T)]\approx 0$$

where $k_1$, $k_2$ are the critical electro-optical coefficients of the media 1, 2. In this case, the following holds true for the relative temperature dependences $(1/E_1)\cdot(\partial E_1/\partial T)$ and $(1/E_2)\cdot(\partial E_2/\partial T)$ of the electric fields in the media 1, 2 to the above-mentioned approximation of infinitely extended stack elements:

$$(1/E_1)\cdot(\partial E_1/\partial T)\approx[d_2/(\in_1\cdot d_2+\in_2\cdot d_1)]\cdot[(\in_1/\in_2)(\partial\in_2/\partial T)-(\partial\in_1/\partial T)]$$

and $(1/E_2)\cdot(\partial E_2/\partial T) \approx [d_1/(\epsilon_1\cdot d_2+\epsilon_2\cdot d_1)]\cdot[(\epsilon_2/\epsilon_1)(\partial\epsilon_1/\partial T)-(\partial\epsilon_2/\partial T)]$.

It is assumed in this case that the thicknesses $d_1$, $d_2$ have essentially no temperature dependence.

If the distance medium 2 is not electro-optically active or the light S does not radiate through it, then the following holds true:

$d_1\cdot[(\partial k_1/\partial T)\cdot E_1+k_1\cdot(\partial E_1/\partial T)]\approx 0$, and thus $(\partial k_1/\partial T)\cdot E_1+k_1\cdot(\partial E_1/\partial T)\approx 0$ The equation already specified above $(1/E_1)\cdot(\partial E_1/\partial T) \approx [d_2/(\epsilon_1\cdot d_2+\epsilon_2\cdot d_1)]\cdot[(\epsilon_1/\epsilon_2)(\partial\epsilon_2/\partial\epsilon T)-(\partial\epsilon_1\partial T)]_1/\partial T)]$ likewise holding true for the relative temperature dependence $(1/E_1)\cdot(\partial E_1/\partial T)$ of the electric field in the medium 1 to the abovementioned approximation of infinitely extended stack elements. The following results from this as an explicit condition for the thicknesses $d_1$, $d_2$:

$[d_1/(\epsilon_1\cdot d_2+\epsilon_2\cdot d_1)]\cdot[(\epsilon_2/\epsilon_1)\cdot(\partial\epsilon_1/\partial T)-(\partial\epsilon_2/\partial T)]+(1/k_1)\cdot(\partial k_1/\partial T)\approx 0$.

The above equations result from the condition that the temperature dependence of the detected change in the state of polarization of the light 5 is intended to be zero, from which $(\partial/\partial T)[k_1\cdot E_1\cdot d_1+k_2\cdot E_2\cdot d_2]=0$.

follows.

The orientation of the BGO crystals in FIG. 1 is advantageously chosen such that the [001] crystal axis is oriented along the electric field E between the electrodes 3, 4. The direction of propagation of the light 5 in the BGO crystals runs parallel to this direction. In this way, only those components of the electric field which likewise run along this direction lead to an alteration of the state of polarization of the light 5. As a result, the sensor is insensitive toward disturbances of the electric field, for example as a result of high-voltage poles arranged in the vicinity of the sensor. Other external disturbances of the electric field are caused for example by contamination of the surface of an insulator that insulates the sensor or by moving electrically conductive objects near the sensor.

In the geometry mentioned, the critical electro-optical coefficient $k_1$ of the electro-optically active medium 1 (BGO) is given as $k_1=n_0^3 r_{41}$, where $n_0$ is the refractive index of the BGO crystal 1 and $r_{41}$ is the relevant electro-optical tensor element for crystalline BGO 1. For BGO, $k_1=9.8$ pm/V (P. A. Williams et al., Applied Optics 35, 3562–3569, a 1996). The relative temperature dependence of $k_1$, for BGO, in accordance with the abovementioned publication by Williams et al., is:

$(1/k_1)\cdot(\partial k_1/\partial T)=1.54\times 10^{-4}/°$ C.

In accordance with J. Link, J. Fontanella, J. Appl. Phys. 51, 4352, 1980 the relative temperature dependence of the dielectric constant $\epsilon_1$ of BGO is $(1/\epsilon_1)\cdot(\partial\epsilon_1/\partial T)=1.8\times 10^{-4}/°$ C.

Since the distance medium 2 used in FIG. 1 is fused silica and, consequently, is not electro-optically active and its dielectric constant $\epsilon_2$ has a negligible temperature dependence (at least in the temperature range of between −40° C. and 80° C. which is relevant to typical applications; see, for example, DIELECTRIC MATERIALS AND APPLICATIONS, edited by Arthur R. von Hippel, Cambridge, Mass., M.I.T., 1954), the calculation of the thicknesses $d_1$, $d_2$ suitable for a temperature compensation is simple.

Figure 2:
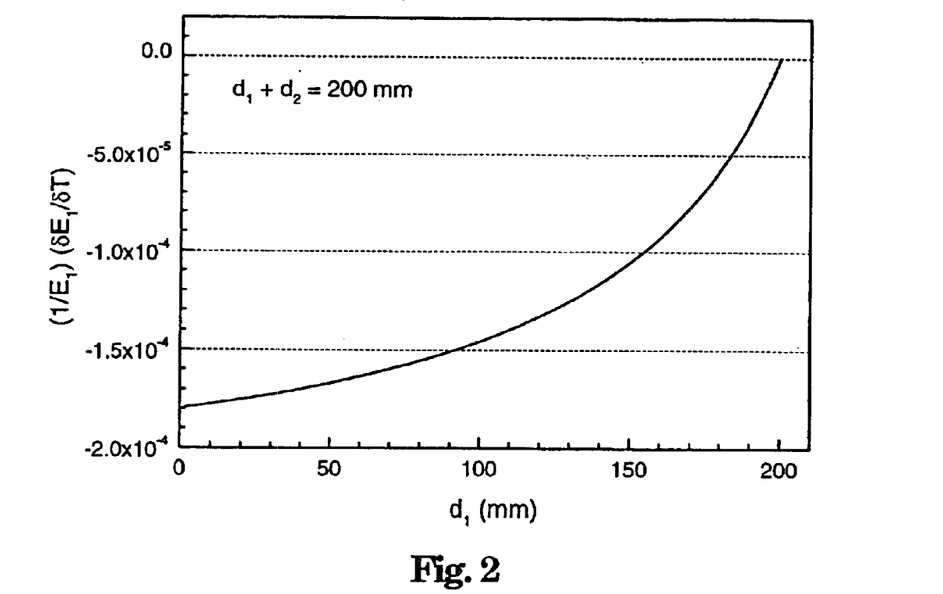
FIG. 2 shows a calculated curve illustrating the dependence of the relative change in the electric field strength in BGO in a BGO fused silica stack with temperature on the effective thickness $d_1$ of the electro-optically active medium BGO.

FIG. 2 shows a calculated curve illustrating the possibility of temperature compensation. The relative temperature dependence $(1/E_1)\cdot(\partial E_1/\partial T)$ of the electric field strength $E_1$ in BGO 1 is plotted on the vertical axis. The effective thickness $d_1$ of the BGO is plotted on the horizontal axis. Furthermore, the distance medium 2 is assumed to be fused silica, and $L=d_1+d_2=200$ mm is assumed, where L is the effective distance between the electrodes 3, 4. The curve illustrated in FIG. 2 reveals that, for $d_1=84$ mm (and $d_2=116$ mm), the relative temperature dependence $(1/E_1)\cdot(\partial E_1/\epsilon T)$ of the electric field strength $E_1$ in BGO 1 is precisely $-1.54\times 10^{-4}/°$ C., so that the temperature dependence of the critical electro-optical coefficient $k_1$ is exactly cancelled. The above-mentioned choice of the effective thicknesses $d_1$, $d_2$ thus has the effect of compensating for the temperature influence on the detected state of polarization of the light 5.

A choice of $d_1=20$ mm produces $(1/E_1)\cdot(\partial E_1/\partial T)=-1.75\times 10^{-4}/°$ C., so that a good compensation is still afforded. In order to remain within a maximum error of ±0.2% in the temperature interval of −40° C. to 85° C. (IEC Standard Class 0.2), $(1/E_1)\cdot(\partial E_1/\partial T)$ must lie in the range $-(1.54\pm 0.3)\times 10^{-4}/°$ C. This permits $d_1$ to be chosen in the range of between 0 mm and 130 mm.

If, instead of BGO, a different electro-optically active medium 1 is used in the case of which the critical electro-optical coefficient $k_1$ decreases rather than increases with temperature, $(1/E_1)\cdot(\partial E_1/\partial T)$ must be positive, or more precisely: the term $(\epsilon_1/\epsilon_2)\cdot(\partial\epsilon_2/\partial T)-\partial\epsilon_1/\partial T$ must be positive:

$(\epsilon_1/\epsilon_2)\cdot(\partial\epsilon_2/\epsilon T)-\partial\epsilon_1/\partial T>0$.

This condition can be met by using alkali or alkaline earth metal glasses as distance medium 2. The values of $\epsilon_2$ and $\partial\epsilon_2/\partial T$ can be varied within wide ranges through suitable choice of material, for example to $\epsilon_2=12$ and $\partial\epsilon_2/\partial T=5\times 10^{-3}/°$ C. See, for example, the above-mentioned publication DIELECTRIC MATERIALS AND APPLICATIONS, edited by Arthur R. Von Hippel, Cambridge, Mass., M.I.T., 1954. By way of example, $K_2O$, $Na_2O$, $Li_2O$ and/or $B_2O_3$ are taken into consideration as an addition in $SiO_2$.

More precise results for thicknesses $d_1$, $d_2$ for a temperature compensation can be obtained if the finite extent of the media 1, 2 is taken into account. Further corrections are possible by incorporating an insulation of the sensor. The text further below illustrates a sheathing of the sensor with silicone, which influences the electric field distribution and has a temperature dependence. The corrections mentioned may be performed for example by means of numerical simulations of the electric field distribution.

In the exemplary embodiment of FIG. 1, the effective thickness $d_1$ corresponds to the total length of the BGO elements. In cases in which the electro-optically active medium 1 and/or the distance medium 2 is formed and/or arranged in a different way, for example in the form of elements having a non-smooth surface and/or having areas not oriented perpendicularly to the field direction, a thickness of one of the media 1, 2 is not defined so simply geometrically. In such cases, therefore, effective thicknesses $d_1$, $d_2$ have to be calculated or determined in some other way. An effective thickness $d_1$, $d_2$ is to be understood to be a thickness which, with regard to its temperature dependence of the quantities taken into account (k, ∈ and, if appropriate, further quantities), is equivalent to a cylindrical sheet element arranged between the electrodes 3, 4 and having areas (see FIG. 1, for example) having the corresponding geometrical thickness which are oriented perpendicularly to the field direction.

The temperature compensation does not necessitate arranging the media 1, 2 in a plurality of individual elements in each case. It is also possible, in principle, to take a single BGO crystal (N=1) and/or also to arrange the distance medium 2 in a single element. However, a more symmetrical and more uniform distribution of a plurality (N≧2) of elements between the electrodes 3, 4 is advantageous for the accuracy of the voltage measurement and, in particular, for the insensitivity of the voltage measurement toward external disturbances of the electric field. The elements, in particular the elements of the electro-optically active medium 1, are advantageously arranged in such a way that the deviation between the (exact) line integration $\int E_{1,x}(x) \cdot dx$ over the electric field between the electrodes 3, 4 and an (if appropriate weighted) sum $\Sigma a_i E_{1,x}(x_1)$ over the local fields prevailing in the individual elements of the electro-optically active medium 1 is minimal:

$$\int E_{1,x}(x) \cdot dx - \Sigma a_i E_{1,x}(x_1) \approx 0$$

Details on this are specified in the patent U.S. Pat. No. 4,939,447 and in the publication Optics Letters 14, 290, 1989. The disclosure content of these texts is hereby expressly incorporated into the description.

An optimized arrangement of the elements may be found by calculations or else by simulations or experimentally. Very good results may also be achieved with two simple arrangements:

(1) All the elements of the medium 1 have the same thickness $\delta_1$, and the outer two elements of the medium 2 have the same thickness $\delta_2'$, which is half as large as the thickness $\delta_2$ of possible further elements of the medium 2.

(2) As in FIG. 1, all the elements of the medium 1 have the same thickness $\delta_1$, and all the elements of the medium 2 have the same thickness $\delta_2$.

The weighting factors $a_i$ specified in the above equation are advantageously used when the individual elements of the electro-optically active medium 1 have different effective thicknesses and/or when it is possible to detect the contribution of different elements individually. This last is possible for example in the event that, in contrast to the illustration in FIG. 1, a single light beam 5 does not radiate through all the elements, rather a plurality of light beams are used which each radiate through one element or else a plurality of elements.

A further major advantage of the arrangement of at least two media 1, 2 between the electrodes 3, 4 is that this enables even high voltages V to be measured ambiguously. It becomes possible for the sensor to have a large half wave voltage $V_x$, while a high dielectric strength is nevertheless had. This is because material in a solid state of aggregation can be arranged, in the form of the media 1, 2, over the entire distance L between the electrodes 3, 4, so that materials having comparable dielectric constants are arranged between the electrodes 3, 4, so that no large jumps in the electrical field strength occur between the electrodes 3, 4.

Figure 3:
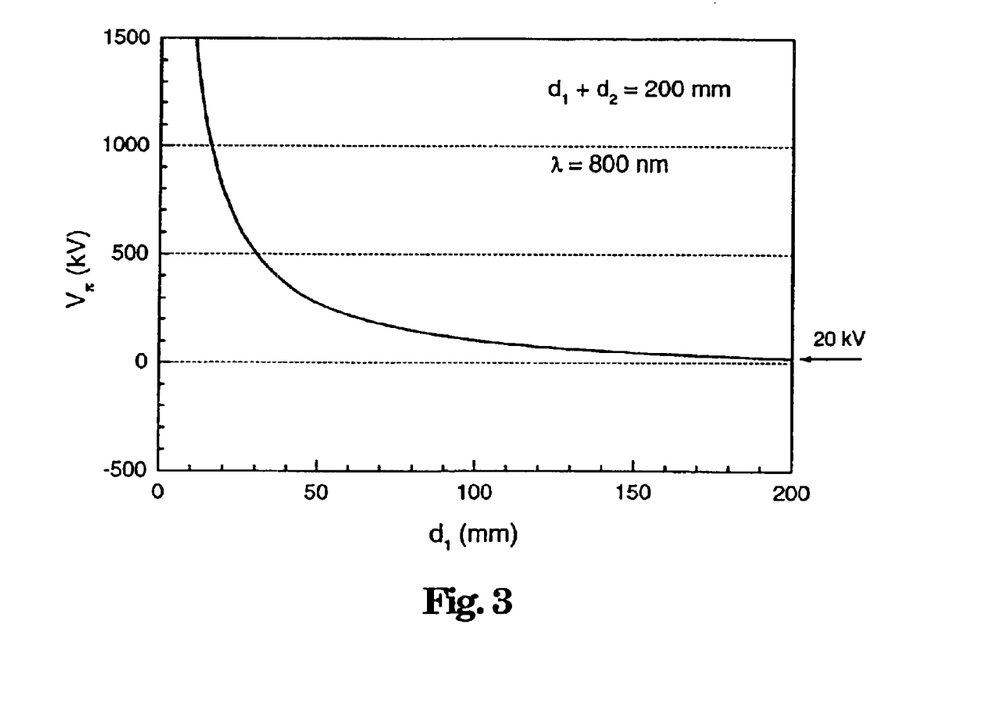
FIG. 3 shows a calculated curve showing the half wave voltage $V_x$ as a function of the effective thickness $d_1$ of the electro-optically active medium, given constant $d_1+d_2$.

FIG. 3 shows a calculated curve illustrating how the half wave voltage $V_x$ of the sensor varies with the thickness $d_1$, $d_1+d_2$ being chosen to be constant equal to L=200 mm. The media 1, 2 are once again BGO and fused silica. If, as specified in connection with FIG. 1, two mutually orthogonally polarized light waves propagate in the BGO 1, then the following holds true for the electro-optically induced phase shift between these light waves:

$$\Gamma = k_1 \cdot V \cdot 2\pi/\lambda,$$

where λ is the wavelength of the light 5. At λ=800 nm, the result for V=20 kV is a phase shift $\Gamma=\pi/2$ and thus $V_x$=40 kV (in transmission geometry, as illustrated in FIG. 1). Thus, voltages of more than 40 kV can no longer be measured unambiguously.

If, as illustrated in FIG. 1, two media 1, 2 are used, then the result is a phase shift $\Gamma^*$, which may be considerably lower than the phase shift $\Gamma$ specified above:

$$\Gamma^* = \Gamma \cdot \in_2 d_1 / (\in_2 d_1 + \in_1 d_2)$$

For $d_1$=20 mm and $d_2$=180 mm, the result is $\Gamma^*$=0.025·$\Gamma$, so that instead of $V_x$=40 kV, the result is: $V_x$=800 Kv. The half wave voltage $V_x$ is thus drastically increased. FIG. 3 specifies half wave voltages $V\pi$ for different $d_1$.

A further possibility for obtaining a larger half wave voltage $V_x$ is to use light 5 having a greater wavelength λ.

Figure 4:
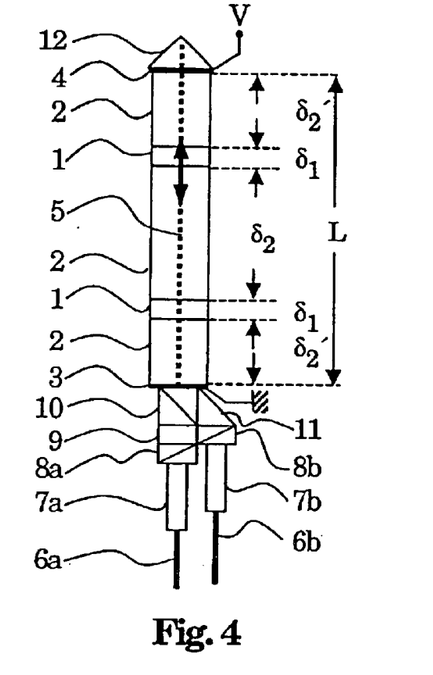
FIG. 4 diagrammatically shows a sensor according to the invention in reflection geometry.

FIG. 4 shows a further possible construction of the sensor. This largely corresponds to the construction illustrated in FIG. 1. It is described on the basis thereof. The outer two elements of the medium 2 have the same thickness $\delta_2'$, which is half as large as the thickness $\delta_2$ of the further element of the medium 2 which is arranged between the two BGO crystals 1 (also see above, version (1) of the simple arrangements of the elements). Instead of in transmission (FIG. 1), the sensor in FIG. 4 works in reflection. A reflective prism 12 is arranged at one end of the stack, preferably at the high-voltage end, which prism directs the light beam 5 back into the stack. Consequently, the light beam 5 traverses the media 1, 2 twice. As a result of the traversal twice, the half wave voltage $V_x$ is halved in comparison with the transmission configuration (FIG. 1). Thus, in comparison with the embodiment discussed above, it would be the case that $V_x$=20 kV, instead of 40 kV.

The λ/4 element 9 may be arranged at the input, as illustrated in FIG. 4, or else at the output (not illustrated). A beam splitter 10, serving for coupling in and coupling out the light beam 5, is arranged at the electrode 3. A deflection prism 11 is advantageously arranged at the beam splitter 10. A major advantage of the reflection geometry is that there is no need, at the high-voltage end, to arrange any optical leads (fibers) which would have to bridge the potential between the two electrodes 3, 4.

Figure 5:
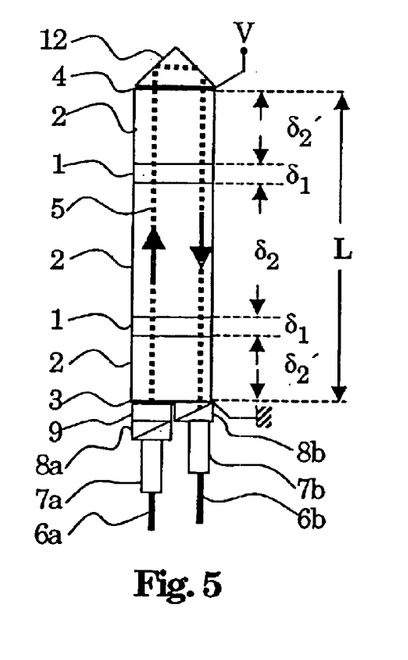
FIG. 5 diagrammatically shows a sensor according to the invention in reflection geometry.

FIG. 5 illustrates a further possible construction of the sensor. This largely corresponds to the construction illustrated in FIG. 4 and is likewise in the reflection configuration. It is described on the basis thereof. Instead of the light beam being coupled into the stack largely centrally via the beam splitter 10, as illustrated in FIG. 4, the light beam 5, before and after the deflection in the reflective prism 12, runs on two paths that are significantly spaced apart and are essentially parallel to one another. As a result, no beam splitter 10 is required, and there is just as little need for a deflection prism 11.

Figure 6:
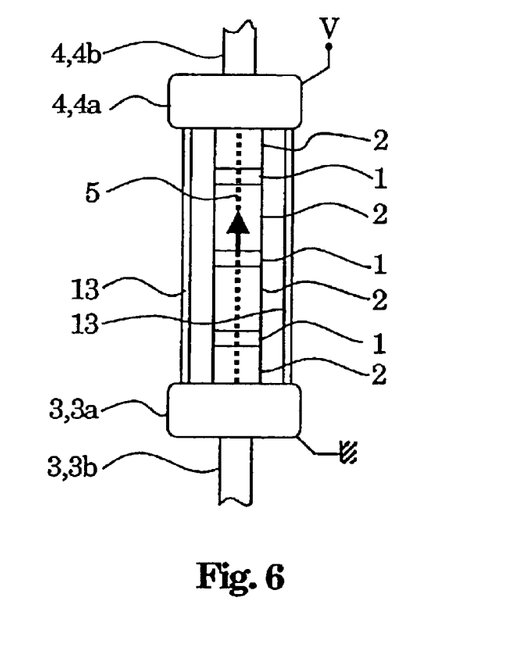
FIG. 6 diagrammatically shows a sensor according to the invention in transmission geometry.

FIG. 6 illustrates a further advantageous embodiment of the sensor. Details of the optical arrangements, which are illustrated in FIGS. 1, 4 and 5, are in part not illustrated here. The sensor illustrated in FIG. 6 works in transmission, but may be operated equally well reflectively, as illustrated for example in FIG. 4 or 5. The case N=3 is illustrated here, that is to say there are three BGO elements. The electrodes 3, 4 in this case comprise a transparent part (not illustrated) through which the light passes into the stack and is coupled out. Furthermore, the electrodes 3, 4 each comprise a field control electrode 3a, 4a, which projects laterally beyond the stack and is conductively connected to the respective transparent part. The field electrodes are formed essentially in sheet-type fashion. Furthermore, the electrodes 3, 4 each comprise a voltage feed 3b, 4b formed essentially in rod-type fashion. For the mechanical stabilization of the sensor, the latter has a plurality (advantageously 3, 4, 5, 6, 7 or 8) of insulator rods 13 which mechanically connect the field control electrodes 3a, 4a to one another.

Figure 7:
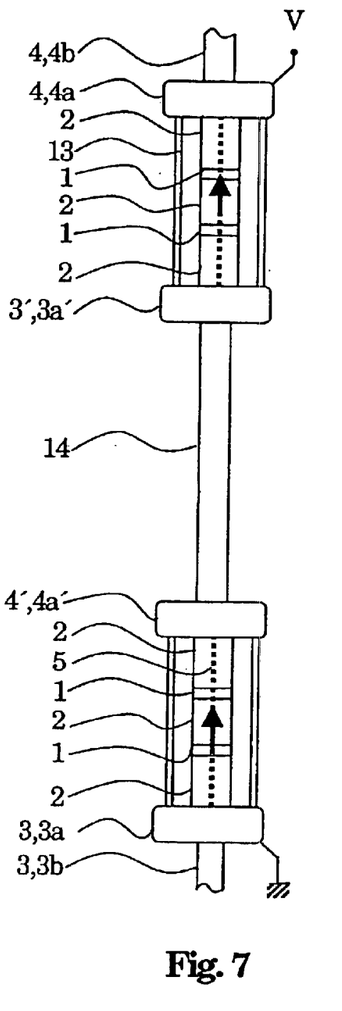
FIG. 7 diagrammatically shows a sensor according to the invention for high voltages, said sensor comprising two sensor rods.

FIG. 7 illustrates a further advantageous embodiment, which is particularly suitable for measurement of very high voltages. This sensor essentially comprises two series-connected sensors which, as illustrated, may for example be similar to that illustrated in FIG. 6. The potential to be measured is present between the electrode 3 of one sensor part and the electrode 4 of the other sensor part. A metallic connecting rod 14 is arranged between the electrode 4' of one sensor part and the electrode 3' of the other sensor part, and connects the two sensor parts conductively and mechanically to one another. It is also possible to combine even more, that is to say 3, 4 or 5, etc., sensor parts to form a sensor.

If a sensor comprises a plurality of series-connected sensors, it is possible to operate them by means of a plurality of light beams 5 or else by means of only one light beam 5. In an advantageous manner, the last partial sensor at the high-voltage end of the sensor may be constructed in reflective fashion and the others in transmissive fashion.

Instead of using two or more sensor rods for managing high voltages, it is also possible to choose a larger electrode distance L. More than N=2, that is to say 3, 4 or 5 or more elements of the electro-optically active medium 1 are then advantageously used.

Figure 8:
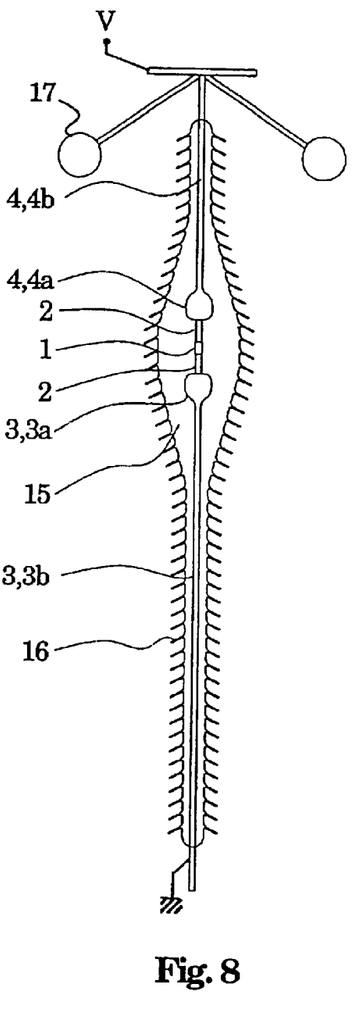
FIG. 8 diagrammatically shows a sensor according to the invention, cast in silicone.

FIG. 8 illustrates a further advantageous embodiment. The illustration of details of the optical arrangement has been dispensed with here, with greater attention being given here to the insulation of the sensor.

A corona ring 17 is arranged at the high-voltage end of the sensor. The voltage feeds 3b, 4b of the electrodes 3, 4, the field control electrodes 3a, 3b and the media 1, 2 are sheathed with silicone 15. The essential parts of the sensor are advantageously cast in silicone 15. The silicone sheathing 15 advantageously has lamellae 16, forming a shielding, on the outside. The entire silicone sheathing 15 is advantageously formed in one piece. The field control electrodes 3a, 4a are formed essentially in sheet-type fashion. They are formed essentially in sheet-type fashion in the sense that they are essentially flat, and essentially round, on their side facing the respective other electrode 4, 3. In this way, the electric field E between the electrodes 3, 4 is highly homogeneous and runs parallel.

The silicone sheathing 15 is formed in cylindrical or barrel-shaped fashion in the region of the field electrodes 3a, 4a and of the media 1, 2. The diameter of the silicone sheathing 15 is advantageously somewhat larger than the diameter of the field electrodes 3a, 4a, in particular 1.1 times up to 6 times as large, and advantageously between 2 and 4 times as large as the diameter of the field electrodes 3a, 4a or, more generally, as a maximum radial extent of the electrodes 3, 4. The thickness of the silicone sheathing 15 or its diameter is advantageously chosen to be so large that the electric field strength, on the outside of the silicone sheathing 15, in the presence of a voltage V, is at most 35 kV/mm, in particular at most 30 kV/mm. In particular cases, a coating with silicone may be sufficient, or a sheathing with silicone 15 which surrounds the sensor, it having a thickness of just 1 mm, if appropriate, at some locations.

A silicone sheathing 15 has the advantage over conventional insulations of having small dimensions and a low weight. Moreover, it is maintenance-free. Conventional, gas-insulated insulations often require pressure monitoring, which is not required in the case of an insulation with a silicone sheathing 15. Moreover, gas-insulated insulations require gastight optical leadthroughs, which are not needed by a sensor with a silicone sheathing 15. Compared with solid insulation materials such as polyurethane which are used as filling material, silicone has the advantage that the dielectric constant of silicone, in contrast to that of polyurethane, has a significantly lower temperature dependence.

A sensor designed for operating voltages of 240 kV may advantageously have the following parameters:

electrode distance L=200 mm electrode diameter at the essentially sheet-type region: 100 mm medium 1=BGO medium 2=fused silica $d_1$=80 mm, divided into two elements each of 40 mm $d_2$=120 mm, divided into 3 elements: 1×60 mm, 2×30 mm silicone sheathing diameter: 300 mm in the region of the electrodes silicone sheathing diameter: 80 mm in the region of the voltage feeds lamella length 5 cm A sensor for operating voltages of 550 kV advantageously comprises two such sensors for operating voltages of 240 kV (cf. FIG. 7).

Simulation calculations have shown that a sensor with sensor rod and silicone sheathing 15 according to the invention has a high insensitivity toward external disturbances of the electric field. By way of example, a sensor of the type as is described above for the operating voltage of 240 kV exhibits, in the case of water films having a thickness of 1 mm on the silicone sheathing 15 in the vicinity of the sensor rod, relative deviations between the voltage signal and the undisturbed state of significantly less than 1%. A water film having a length of 40 mm which is arranged at the level of the center of the sensor rod effects a relative voltage drop of only 0.04%, by way of example. A grounded metal cylinder at a distance of 2 m from the sensor, which is oriented parallel to the sensor rod and projects beyond the latter by 1 m, produces a relative voltage rise of only 0.04%.

The alternative or additional features presented further above and below are optional and can be combined arbitrarily among one another and also with the exemplary embodiments illustrated in the description.

The electro-optically active medium 1 may be any electro-optically active material, preferably an electro-optically active crystal. Various suitable electro-optically active materials are specified in the abovementioned EP 0 682 261 A2. The disclosure content of this document is hereby expressly incorporated into the description.

The distance medium 2 may be of a gaseous, liquid or advantageously of a solid state of aggregation. It may also be vacuum. It may be electro-optically active or not electro-optically active. In an advantageous manner, the media 1, 2 are also chosen in such a way that they have only a small refractive index difference. This avoids large reflection losses at the interfaces. By way of example, in the abovementioned example with BGO 1, which has a refractive index of 2.07 at 800 nm, and fused silica 2, which has a refractive index of 1.46 at 800 nm, the reflection losses amount to about 3% per reflection. If the second medium 2 is a gas, for example $SF_6$, then the result is a reflection loss of about 12.1% per reflection.

In order to obtain further degrees of freedom in the design of the sensor, stacks of the following type may also be taken into account: instead of using individual BGO sheets, it is also possible to use pairwise arrangements of BGO crystals, one crystal component of the pair being oriented crystallographically differently than the other crystal component. The orientation is chosen in such a way that, as a result of the electro-optical effect, the alteration of the state of polarization of the light 5 in one crystal component is partly reversed again, that is to say partly cancelled, by the alteration of the state of polarization of the light 5 in the other crystal component of the pair. In particular, the crystal components may be oriented contrastingly with respect to one another and have mutually different thicknesses. It is thus possible to achieve an increase in the half wave voltage $V_\pi$. It goes without saying that the crystal components may comprise different electro-optically active materials. The elements from the second crystal component may also be interpreted as elements of the distance medium 2.

The media 1, 2 may advantageously be connected to one another by means of a transparent adhesive.

Between the electrodes 3, 4, even further electro-optically active materials and/or further materials serving as a distance medium 2 may also be arranged or a plurality of different materials may serve as electro-optically active medium 1 and/or as distance medium 2. From the statements above, it is immediately clear to the person skilled in the art how to construct a sensor according to the invention with more than two media.

The electrodes 3, 4 are advantageously transparent. Transparent in this case means transmissive to the wavelength of the light 5 used. However, it is also conceivable to use nontransparent electrodes 3 and/or 4, the light 5 then being coupled in and/or out for example at a recess, a hole in the electrode 3 and/or 4.

In the exemplary embodiment of FIG. 1, the effective distance L between the electrodes 3, 4 is the geometrical length covered by the light 5 between the electrodes 3, 4. L thus corresponds to the minimum geometrical distance between the electrodes 3, 4. However, by way of example, the effective distance L may differ from the geometrical distance between the electrodes when the field electrodes 3a, 4a have a bent profile in the radial direction, so that the minimum geometrical distance between the field electrodes 3a, 4a is smaller in the radial outer region than in the radial inner region, where the transparent parts of the electrodes 3, 4 are arranged. In the case also of electrodes 3, 4 not oriented parallel to one another, the geometrical minimum distance between the electrodes would generally not correspond to the effective distance L between the electrodes 3, 4. The effective distance L between the electrodes 3, 4 may depend on the light guidance.

In the exemplary embodiments of FIGS. 1, 4, 5, 6, 7 the effective thicknesses $d_1$, $d_2$ of the media 1, 2 correspond to the geometrical total thickness of the individual elements of the relevant medium 1, 2. However, the effective thicknesses $d_1$, $d_2$ may also deviate from such a geometrical thickness. By way of example if the elements of a medium are not plane-parallel or if the elements of a medium are indeed plane-parallel, as in the exemplary embodiments, but are arranged in angled fashion with regard to the distance between the electrodes, 3, 4. The effective thicknesses $d_1$, $d_2$ of the media 1, 2 may then depend on the light guidance.

The effective thickness $d_1$, $d_2$ of one of the media 1, 2 specifies that geometrical total thickness which the medium 1, 2 would have if it were arranged between the electrodes in the form of one or a plurality of elements formed in plane-parallel fashion and acted identically to the medium 1, 2 in its actual form. Identically acting in this case means that the same change in the state of polarization of the light 5 is brought about for the same voltage V present. In this case, the orientation of the plane-parallel elements is to be chosen such that the normals to the plane-parallel areas run along the effective distance L between the electrodes 3, 4.

For the effective thickness $d_1$ it holds true that $d_1 < L$. It furthermore holds true that $d_1 + d_2 < L$ or $d_1 + d_2 \leq L$. The thicknesses of different elements of the media 1, 2 (in particular of the electro-optically active medium 1) within a sensor rod may vary, for example in order to take account of nonuniform field distributions and to obtain more accurate measurements.

The light 5 preferably has a short coherence length. A light beam 5 preferably traverses the entire sensor rod (stack), since this necessitates only one optical lead and an optical return. However, it is also possible to interrogate one or a plurality of elements with a respective light beam 5.

Depending on the type of electro-optically active medium 1 and the crystalline orientation thereof, it is also possible to construct sensors in which, in contrast to the embodiments illustrated, the light beam 5 does not run parallel to the axis of the sensor rod or parallel to the field lines of the electric field generated by the voltage V (longitudinal Pockels effect). By way of example, the light 5 may run perpendicularly to (transverse Pockels effect). In the case of a plurality of elements of the electro-optically active medium 1, a separate light beam may then preferably be radiated through each element. By means of reflection means and/or optical fibers, however, it is also possible for one light beam 5 to be radiated jointly through a plurality or all of the elements of the electro-optically active medium 1. Generally, however, such a sensor has a large transverse sensitivity (influencing by external fields which do not have the same orientation as the field to be measured).

The optical feed fiber 6a may be a multimode fiber or advantageously also a polarization-maintaining single-mode fiber. The latter guides linearly polarized light and has the advantage that it is less susceptible to bending-induced intensity losses.

It goes without saying that the silicone sheathing 15 may not only serve for insulating a temperature-compensated sensor but may also be used for an arbitrary other, preferably electro-optical, voltage sensor. In particular for an electro-optical voltage sensor in which a sensor rod, in particular a sensor rod comprising one or a plurality of media 1, 2 of a solid state of aggregation, is arranged between the electrodes 3, 4.

Instead of silicone sheathings 15, it is also possible to use insulation tubes, preferably made of glass-fiber-reinforced plastic, for insulating the sensor. Such an insulation tube is filled with an insulation filling, which, by way of example, may be gaseous, $SF_6$ or $N_2$ for example, or may be a solid, polyurethane for example. The sensor is then arranged in the insulation tube, which sensor, by way of example, may also comprise two, three or more series-connected sensors (cf. FIG. 7).

If, according to the invention, temperature influences on the detected state of polarization of the light 5 are essentially compensated for or temperature influences essentially cancel one another out, this is intended to mean that a reduction of the temperature influences is obtained, and in particular that the temperature influences become so small as a result of the compensation that they are reduced at least by a factor of 2 or 3 or 5 or an order of magnitude compared with an uncompensated sensor.

The features mentioned may be advantageous jointly or else individually or in any desired combination.

List of Reference Symbols
1 Electro-optically active medium, electro-optical crystal, BGO crystal
2 Distance medium, fused silica
3 Electrode
3a Field control electrode
3b Voltage feed
4 Electrode
4a Field control electrode
4b Voltage feed
5 Light, light beam
6a Optical feed fiber
6b Optical return fiber
7a,7b Collimator lens
8a,8b Polarizer
9 λ/4 element
10 Beam Splitter
11 Deflection prism
12 Reflective prism
13 Insulator rod
14 Connecting rod
15 Silicone
16 Lamellae (shielding)
17 Corona ring
$d_1$ Effective thickness of the electro-optically active medium
$d_2$ Effective thickness of the distance medium
E Electric field, field line
$k_1$ Critical electro-optical coefficient of the electro-optical medium
$k_2$ Critical electro-optical coefficient of the distance medium
L Effective electrode distance
T Temperature
V Electrical voltage to be measured
$V_x$ Half wave voltage
α Thermal expansion coefficient
$δ_1$ Effective thickness of an element of the electro-optically active medium
$δ_2$, $δ_2'$ Effective thickness of an element of the distance medium
$∈_1$ Dielectric constant of the electro-optically active medium
$∈_2$ Dielectric constant of the distance medium
Γ,Γ* Phase shift

What is claimed is:

1. An electro-optical voltage sensor for measurement of an electrical voltage V, the voltage V being present between two electrodes and generating an electric field, the electrodes being arranged in a manner spaced apart from one another, and an electro-optically active medium being arranged between the electrodes, into which medium light can be radiated, it being possible to influence the state of polarization of said light in the electro-optically active medium by means of the electric field and to detect it after emergence from the electro-optically active medium, it being possible to determine the voltage V from the detected state of polarization,
wherein
a distance medium is arranged between the two electrodes, the electro-optically active medium being arranged with an effective thickness d1 and the distance medium with an effective thickness d2 between the two electrodes and the effective thicknesses d1, d2 being chosen in such a way that temperature influences on the detected state of polarization of the light are essentially compensated for.

2. The voltage sensor as claimed in claim 1, wherein the effective thickness d2 of the distance medium and the effective thickness d1 of the electro-optically active medium are chosen in such a way that the influences of the temperature dependences of temperature-dependent material constants of the distance medium and of the electro-optically active medium on the detected state of polarization of the light are essentially compensated for.

3. The voltage sensor as claimed in claim 2, wherein the temperature-dependent material constants are
critical electro-optical coefficients (k),
dielectric constants (∈) and
thermal expansion coefficients (α).

4. The voltage sensor as claimed in claim 1, wherein the effective thickness d2 of the distance medium and the effective thickness d1 of the electro-optically active medium (4) are chosen in such a way that the influences of the temperature dependences of the dielectric constant ∈1 of the electro-optically active medium of the dielectric constant ∈2 of the distance medium and,
if the distance medium is not electro-optically active or the light does not radiate through the distance medium: of the critical electro-optical coefficient k1 of the electro-optically active medium, and
if both the electro-optically active medium and the distance medium are electro-optically active and light is radiated through them: of the critical electro-optical coefficient k1 of the electro-optically active medium and of the critical electro-optical coefficient k2 of the distance medium,
on the detected state of polarization of the light essentially cancel one another out.

5. The voltage sensor as claimed in claim 4, wherein the following holds true:

$$d_1 \cdot [(∂k_1/∂T) \cdot E_1 + k_1 \cdot (∂E_1/∂T)] + d_2 \cdot [(∂k_2/∂T) \cdot E_2 + K_2 \cdot (∂E_2/∂T)] ≈ 0$$

if the light also radiates through the distance medium, and:

$$(∂k_1/∂T) \cdot E_1 + k_1 \cdot (∂E_1/∂T) ≈ 0$$

if the light does not radiate through the distance medium or the latter is not electro-optically active;
where E1 is the electric field strength in the electro-optically active medium and E2 is the electric field strength in the distance medium,
and in particular where the aforementioned electric field strengths are approximated as $$E1 ≈ ∈2 \cdot V/(∈2 \cdot d1 + ∈1 \cdot d2) \text{ and}$$

$$E2 ≈ ∈1 \cdot V/(∈2 \cdot d1 + ∈1 \cdot d2).$$

6. The voltage sensor as claimed in claim 1, wherein the distance medium is transparent and of a solid state of aggregation, and in that the light radiates through both the distance medium and the electro-optically active medium.

7. The voltage sensor as claimed in claim 1, wherein the distance medium has a vanishing critical electro-optical coefficient k2 and/or a vanishing temperature dependence ∂k2/∂T of its critical electro-optical coefficient k2, and in particular has a negligible temperature dependence ∂∈2/∂T of its dielectric constant ∈2.

8. The voltage sensor as claimed in claim 1, wherein a stack of N elements of the electro-optically active medium and N+1 elements of the distance medium is arranged between the electrodes, N being an integer where N≧1, and an element of the electro-optically active medium in each case being arranged between two adjacent elements of the distance medium, the first and the last element in the stack being in contact with a respective one of the two electrodes and, in particular, each of the elements being essentially cylindrical with essentially the same cylinder diameter.

9. The voltage sensor as claimed in claim 8, wherein the elements of the electro-optically active medium have such an effective thickness and are arranged between the electrodes in such a way that a deviation between the voltage determined by means of the voltage sensor and the voltage V to be measured is minimal.

10. The voltage sensor as claimed in claim 8, wherein the elements of the electro-optically active medium all have the same effective thickness $\delta 1 = d1/N$, and wherein either (a) the elements of the distance medium have an effective thickness $\delta 2 = d2/N$, but the outer two elements of the distance medium in the stack have an effective thickness $\delta 2' = d2 \cdot (2 \cdot N)$, or wherein (b) the elements of the distance medium have an effective thickness $\delta 2 = d2/(N+1)$.

11. The voltage sensor as claimed in claim 1, wherein the electrodes together with the electro-optically active medium and the distance medium are cast in silicone.

12. The voltage sensor as claimed in claim 1, wherein the electrodes together with the electro-optically active medium and the distance medium are cast in silicone, the silicone in the region of the electrodes, of the electro-optically active medium and of the distance medium being essentially in cylindrical or barrel-shaped fashion with a diameter which is between 1.1 and 6 times, in particular between 2 and 4 times, as large as a maximum radial extent of the electrodes.

13. The voltage sensor as claimed in claim 11, wherein the silicone in the region of the electrodes, of the electro-optically active medium and of the distance medium, is formed essentially in cylindrical or barrel-shaped fashion, and the electrodes have electrically conductive voltage feeds, which are formed essentially in rod-type fashion and are likewise cast in silicone, the silicone in the region of the voltage feeds being formed essentially in cylindrical fashion and having a smaller diameter than in the region of the electrodes, of the electro-optically active medium and of the distance medium, and, in particular, wherein the silicone has a shielding on the outside.

14. The voltage sensor as claimed in claim 1, wherein the electro-optically active medium is crystalline BGO which is oriented with its direction parallel to the direction of propagation of the light, wherein the direction of propagation of the light essentially runs along the electric field generated by the voltage V, and in that the distance medium is fused silica.

15. A method for measurement of an electrical voltage V, the voltage V being present between two electrodes arranged in a manner spaced apart from one another and generating an electric field, light being radiated into an electro-optically active medium arranged between the electrodes, a state of polarization of the light being influenced in the electro-optically active medium by means of the electric field and the light being detected after emergence from the electro-optically active medium and the voltage V being determined from the detected state of polarization, wherein a distance medium is arranged between the two electrodes, an effective thickness d2 of the distance medium and an effective thickness d1 of the electro-optically active medium being chosen in such a way that temperature influences on the detected state of polarization of the light are essentially compensated for.

* * * * *